United States Patent [19]

Clement et al.

[11] 4,324,610
[45] Apr. 13, 1982

[54] METHOD FOR THE CONTROLLED MELTING OF SEMICONDUCTOR BODIES

[75] Inventors: Donald R. Clement, Phoenix; Roger G. Nikirk, Tempe, both of Ariz.

[73] Assignee: Motorola, Inc., Schaumburg, Ill.

[21] Appl. No.: 888,072

[22] Filed: Mar. 20, 1978

[51] Int. Cl.³ ............................................. C01B 15/18
[52] U.S. Cl. ................................ 156/602; 156/617 M
[58] Field of Search ............ 156/602, 617 M, 617 SP, 156/DIG. 83, DIG. 65, 608

[56] References Cited

U.S. PATENT DOCUMENTS

| 840,826 | 1/1907 | Colby | 156/DIG. 83 |
| 2,961,305 | 11/1960 | Dash | 156/608 |
| 3,360,405 | 12/1967 | Keller | 156/617 M |

FOREIGN PATENT DOCUMENTS 42-4766 2/1967 Japan ............................ 156/617 SP

*Primary Examiner*—Hiram Bernstein
*Attorney, Agent, or Firm*—John A. Fisher

[57] ABSTRACT

A method for the controlled melting of an end of a polycrystalline semiconductor body. The polycrystalline body is divided into two or more segments and the segments are positioned in a spaced apart relationship so as to be electrically isolated from each other by narrow gaps. One end of the segments is heated by an external heating means such as by induction heating to cause a portion of the end of the segments to melt. Some of the molten material so formed then flows into the gap separating the segments and electrically shorts together the segments. The opposite ends of the segments are connected to an electrical power supply and a heating current is passed through the segments and through the molten material bridging the gaps. Separately adjusting the heating effects of the external heating means and the heating current makes possible the controlled heating and controlled melting of the end portions of the segments.

10 Claims, 6 Drawing Figures

METHOD FOR THE CONTROLLED MELTING OF SEMICONDUCTOR BODIES

BACKGROUND OF THE INVENTION

This invention relates to an improved method for the controlled heating and melting of an end of a semiconductor body and more particularly, to the controlled melting of the end of a polycrystalline semiconductor body and the pulling of a monocrystalline ingot from the molten material.

The electronics industry requires large quantities of monocrystalline semiconductor material, especially silicon, for the fabrication of transistors, diodes, integrated circuits, and the like. The monocrystals are used by the electronics industry in the form of thin, circular wafers or slices a few inches in diameter. The wafers are produced by first growing a monocrystalline ingot or boule which is a long cylindrical, monocrystalline body of approximately the same diameter as that desired for the wafers. The ingot is then sawed into wafers which are lapped and polished to the desired form. Most of the monocrystalline ingots are produced by one of three growth techniques: the Czochralski method, the pedestal method, or the floating zone method. There are inherent limitations in each of these methods as heretofore practiced.

Most crystals in the semiconductor industry are grown by the Czochralski method. In this method high purity polycrystalline silicon is melted in a refractory crucible along with desired amounts of dopant impurities. A seed crystal is dipped into the molten material and then slowly withdrawn to nucleate monocrystalline growth as the molten material cools and freezes. Silicon melts at about 1420° C., and at this temperature any material from which the crucible can be fabricated will adversely dope or contaminate the molten silicon. Monocrystals grown by this method, therefore, have undesirable concentrations of unwanted impurities.

The pedestal method and the floating zone method are similar in that each is a crucible-free growth method. In the floating zone method an elongated polycrystalline body is vertically positioned. The lower end of the polycrystalline body is melted by induction heating from an RF induction heating coil located in proximity to that lower end. The molten material is held in place by surface tension and by the levitating effects of the RF field. The molten zone is caused to move along the length of the polycrystalline body. As the molten zone passes, the material refreezes as a monocrystal, with monocrystalline growth again being nucleated by a seed crystal. Since the molten zone is not supported by a crucible, no undesirable contaminants are introduced into the growing monocrystal. The size of the crystal which can be grown, however, is severely limited. As the diameter of the crystal increases, so also does the volume of molten material. As the volume increases, a point is reached at which the surface tension and levitational forces can no longer support this mass of material and the melt "spills". This results from the fact that the material is heated solely by induction heating from an RF induction coil. Induction heating is a surface phenomenon, with currents being induced in the skin or surface of the polycrystalline body. As the power to the induction coil is increased to melt through the entire cross section of the polycrystalline body, the length of the molten zone also increases, thus increasing the volume of molten material. Consequently, float zone crystals are limited to three or perhaps four inches in diameter. The large crystals have severe radial nonuniformities because of temperature gradients which exist between the center of the semiconductor body and its surface during the crystal growth process. Thus crystals are limited in both size and crystal perfection.

In the pedestal growth method a pool of molten material is maintained on the top end of a polycrystalline body. As in the float zone method, this pool of molten material is maintained by induction heating from an RF induction heating coil. A seed crystal can be dipped into the pool of molten material and then slowly withdrawn, forming a monocrystalline ingot as the material freezes. Like the float zone method, the molten material is held in place by the combined forces of surface tension and levitation from the RF field. The size of the crystal that can be grown by this method and also the perfection of that crystal is thus again severely limited. Increasing the diameter of the crystal requires that a greater mass of material be rendered molten and this poses the same problems of radial temperature gradients and containment of the melt. Crystals grown by the pedestal method have typically been limited to about one and a half to two inches in diameter.

Accordingly it an object of this invention to provide an improved method for the controlled melting of an end portion of a polycrystalline semiconductor body with reduced radial temperature gradients.

It is a further object of this invention to provide an improved method for the crucible free growth of monocrystalline semiconductor bodies.

It is a still further object of this invention to provide a process for the crucible free growth of large diameter, high perfection monocrystalline silicon ingots.

SUMMARY OF THE INVENTION

The attainment of these and related objects and advantages may be achieved through the use of the novel crystal heating method herein disclosed.

A method is provided for the controlled heating and melting of an end of an elongated semiconductor body. In one embodiment of that invention the semiconductor body is divided into a plurality of elongated segments. The elongated segments are positioned in a spaced apart relationship with narrow gaps providing electrical isolation between the segments. One end of the segments is heated by an external heater which causes a portion of the ends to melt. Part of the molten material so formed flows into the gaps separating the segments and electrically shorts the segments together. Electrical contact is made to the opposite ends of the segments and a heating current is passed through the segments and the molten material. The ends of the segments are thus heated and melted and a mass of molten semiconductor material is maintained on the ends of the segments by the combined heating of the external heater and the heating current. A semiconductor seed crystal can then be inserted into the mass of molten material and a monocrystalline semiconductor ingot pulled therefrom.

The particular elements of the invention and the benefits to be derived therefrom will be more readily apparent after review of the following more detailed description of the invention taken in connection with the drawings.

DETAILED DESCRIPTION OF PREFERRED EMBODIMENTS

Figure 1:
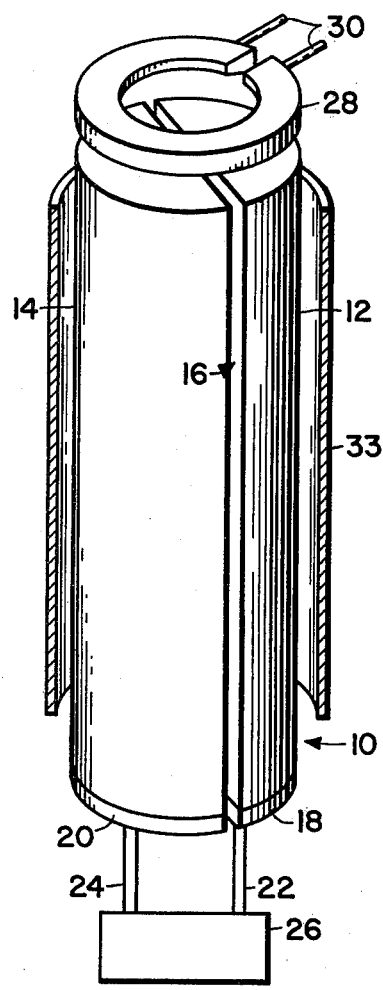
FIG. 1 shows a perspective view of a divided semiconductor body and the means for controllably heating an end of that body.

There is shown in FIG. 1 a schematic representation of an elongated semiconductor body 10 which has been divided into two substantially equally sized portions 12, 14. In order to grow, for example, a five inch diameter monocrystalline silicon ingot the semiconductor body 10 might be a high purity polycrystalline silicon body about 10 inches in diameter. The size of the semiconductor body 10 required would, of course, depend upon the desired monocrystalline ingot size. The semiconductor body 10 might be from about 1 to 4 feet in length. The two half round segments 12, 14 are cleaned and then positioned in such a way as to resemble a cylinder with a narrow gap 16 between the two segments. The lower end of the segments 12, 14 are contacted by electrical connectors 18, 20, respectively. These connectors can be of graphite or other material which is highly electrically conductive. The connectors 18, 20 are in turn contacted by electrical leads 22, 24 which conduct power from a power source 26 which can be either AC or DC. The leads 22, 24 could be, for example, of water cooled copper. The water cooling is necessary because of the high currents the leads will be carrying. Located above the segments 12, 14 but in close proximity to their upper end is an RF induction coil 28, which is connected by leads 30 to an RF generator (not shown). The RF coil 28 can be a conventional coil as known in the crystal growing art and should have an interior diameter slightly larger than the intended diameter of the monocrystalline ingot to be pulled. The RF coil 28 shown schematically in FIG. 1 may be of the substantially flat "pancake coil" type.

Figure 2:
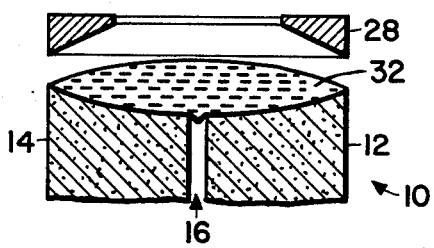
FIG. 2 shows a cross-sectional view of the molten zone at the end of a semiconductor body.

In FIG. 2, the top of the segments 12, 14 are shown in cross section as the process commences. Power is supplied to the RF coil 28 to heat and melt a portion of the top of the polycrystalline segments. As is well known in the art, it is sometimes difficult to initiate induction heating in the very pure, high resistivity polycrystalline segments. It may be necessary, therefore, to employ a preheater to initiate the process. The use of a preheater is well known, and will be described only briefly. The preheating can be accomplished, for example, by temporarily placing a graphite disk near the tops of the segments. The graphite disk is then inductively heated by the induction coil 28. The heated graphite disk then, in turn, heats the tops of the polycrystalline segments. After the polycrystalline silicon is heated to a few hundred degrees centigrade, its resistance drops sufficiently to allow the RF energy to inductively couple directly with the silicon. When this happens, the graphite preheater disk can be removed. The inductive heating of the top of the segments 12, 14 by the induction coil 28 can be continued to cause the melting of a portion of the tops of the segments. Part of the molten mass of material 32, so formed, then flows into the gap 16, as shown, to electrically short together the two segments 12, 14. Shorted together in this manner, the segments 12, 14 and the molten material 32 form part of a complete electrical circuit in series with the power supply 26. Again, the pure semiconductor material of which the segments 12, 14 are comprised is highly resistive. Because of the high resistance, especially when the segments are long, it is difficult to force large currents through the segments. A second preheater 33 may thus be required. This preheater 33 can be, for example, a carbon or nichrome resistance heater, or a set of infra red (IR) lamps, or the like. This preheater 33 is used to heat the segments 12, 14 to a few hundred degrees and thus to cause a reduction in the resistance through the segments. Heating current from the power supply 26 can then flow readily in this circuit to further heat the polycrystalline body 10. The polycrystalline silicon body 10 can be controllably heated and the upper ends of the segments 12, 14 can be melted by the combined heating effects of the induction heating coil 28 and this heating current. The combined heating effects from the two separate heat sources permits a relatively uniform temperature distribution across the tops of the segments. By the nature of induction heating, the induction heating coil tends to heat the surface portion and the outer portions of the tops of the segments 12, 14. The heating current, however, preferentially heats the center of the body, with the greatest heating being in the vicinity of the gap 16. The relative amount of heat supplied by each of the heat sources can be adjusted to produce the desired temperature distribution, with one source heating the outer portions and the other source heating the inner portions. Together, the two heat sources melt the entire cross-section of the body. In so doing, the amount of molten material produced by this combined heating is greatly reduced from the amount that would be produced if the cross-section was melted by either heat source alone. The relative amounts of heating from each source will depend upon the size of the polycrystalline body 10, and upon the size of the ingot pulled from the molten material 32. To produce a 4 to 5 inch diameter ingot the power supply 26 should be capable of supplying several thousand amperes of current. The width of the gap 16 must be maintained at less than about 100 mils, and preferably would be about 50 to 70 mils. A wider gap allows the molten material to run too far down the gap; a narrow gap might cause arcing between the segments.

Figure 3:
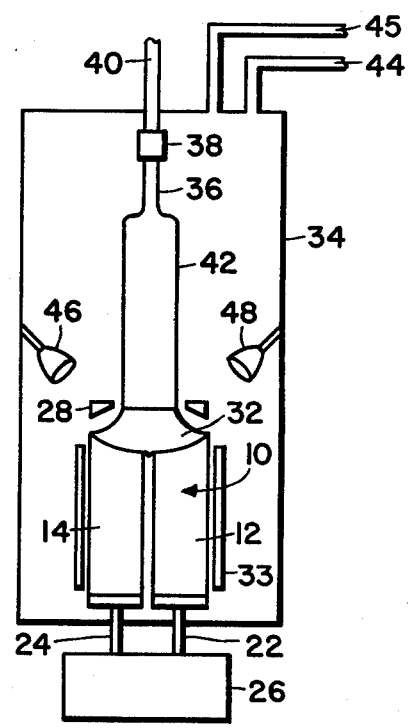
FIG. 3 depicts an apparatus which can be used in practicing the invention.

FIG. 3 depicts a representative apparatus within which the invention may be practiced. The apparatus is comprised of a sealed enclosure 34 within which the ambient can be controlled. A crystal seed 36 is clamped in a holder 38 which, in turn, is connected to a pull rod 40. The pull rod 40 can move in a vertical direction and can also be made to rotate. To initiate the process, the seed 36 is dipped into the molten material 32. The pull rod 40 and thus the seed 36 are rotated to provide a mixing or stirring of the molten material 32 and to minimize thermal gradients. The seed 36 is then slowly withdrawn from the melt. By controlling the speed with which the seed is withdrawn, the single crystal ingot 42 which forms as the molten material refreezes can be made to neck out to the desired diameter. During the growth process the ambient within the chamber 34 can be controlled by introducing gases through inlets such as shown schematically at 44 and 45. The ambient gases might consist of an inert gas such as argon and one or more doping gases. The doping gases impart the correct resistivity to the growing crystal 42. For precise control of the crystal resistivity, the doping gases, of course, will most likely be introduced in close proximity to the molten zone 32. The doping gases might be, for example, $B_2H_6$ or $PH_3$ to dope the crystal P-type or N-type respectively. In a preferred embodiment, the induction heating coil 28 is fixed in position within the chamber 34. The polycrystalline body 10 must be moveable in a vertical direction, therefore, to advance the body upward as the top portion is melted and the molten material is used to grow the ingot 42. Means for advancing the polycrystalline body are well known in the art, and hence have not been shown in the Figure. Additional heaters may be desirable to add a further degree of flexibility to the temperature control. Such heaters are shown in the Figure as IR lamps 46, 48. The additional heaters could also be, for example, conventional resistant heaters. The heaters 46, 48 can be positioned to direct their heat, as needed, on the tops of the segments, the molten material, or the growing ingot.

Figure 4:
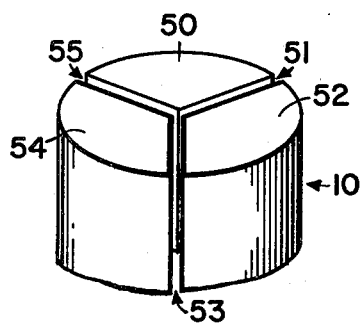
FIGS. 4-6 show alternate forms of semiconductor bodies usable in the invention.
Figure 5:
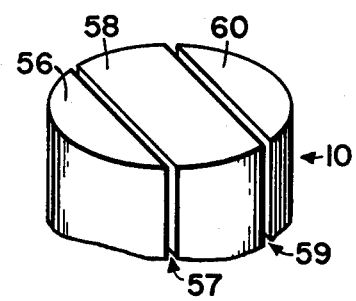
Figure 6:
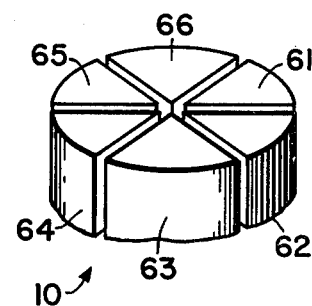

FIGS. 4–6 show alternate embodiments of the polycrystalline body which may be used in practicing the method of the invention and which can provide a further control of the temperature distribution at the top of the polycrystalline silicon body. In FIG. 4 the polycrystalline body 10 is divided into three segments 50, 52, 54 by the three radially directed slots 51, 53, 55. In this embodiment, the heating current might be supplied by a three phase power source with each of the three polycrystalline segments being connected to one of the phase legs. FIG. 5 shows another embodiment in which the polycrystalline body 10 is divided into three segments 56, 58, 60. The three segments are separated by two parallel gaps 57, 59. In this embodiment the three segments might be connected to either an AC or DC power supply with the center segment 58 common to both the electrical circuit through segment 60 and the electrical circuit through segment 56. FIG. 6 shows a still further embodiment in which the polycrystalline body 10 is divided into a plurality of segments 61–66. The segments can be connected to power supplies, for example, in a series of alternating pairs. The various embodiments shown allow one to alter or tailor the temperature distribution at the top of the polycrystalline body for a number of different operating conditions such as the diameter of the polycrystalline body and the diameter of the monocrystalline ingot.

Thus it is apparent that there has been provided, in accordance with the invention, a method for controllably melting an end of a semiconductor body and for growing a monocrystalline ingot that fully satisfies the objects set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A method for converting a polycrystalline semiconductor body to a substantially monocrystalline semiconductor body comprising the steps of: dividing said polycrystalline body into electrically isolated vertical segments separated by a narrow gap and having a top portion; connecting each of said segments to a source of electrical power; providing a radio frequency induction coil located in proximity to said top portions of said segments and connected to a source of radio frequency power; induction heating said top portions of said segments by means of said induction coil to cause said top portions to melt; allowing the molten material so formed to flow into said gap and to electrically connect together said segments; passing current from said source of electrical power through said segments and said molten material to resistance heat said segments; continuing said induction heating and said resistance heating, said resistance heating and said induction heating together being sufficient to maintain a mass of molten semiconductor material on said top portions; inserting a semiconductor seed crystal into said mass of molten material and pulling said substantially monocrystalline semiconductor body therefrom.

2. The method of claim 1 wherein said polycrystalline body is divided into two vertical segments.

3. The method of claim 2 wherein said narrow gap is between about 50 and 70 mils.

4. The method of claim 1 further comprising using additional external heater means to further heat said vertical segments.

5. A method for the controlled melting of an end of a semiconductor body comprising the steps of: dividing said body into segments, each of said segments having a first end and a second end; positioning said segments in a spaced apart relationship with a narrow gap therebetween; heating said first ends of said segments by means external to said segments to melt a portion thereof, the molten semiconductor material so formed bridging said gap; electrically contacting said second ends of said segments and passing a heating current through said segments and said molten material; and continuing to heat said semiconductor body by said means external and by said heating current.

6. The method of claim 5 wherein said means external is induction heating using an induction heating coil.

7. The method of claim 5 wherein said semiconductor body is a polycrystalline silicon body.

8. The method of claim 5 wherein said gap is between 50 and 70 mils.

9. The method of claim 5 wherein said body is divided into two vertical segments.

10. A method for the controlled melting of an end of an elongated semiconductor body comprising the steps of: longitudinally cutting said body to divide said body into a plurality of elongated segments joined together by an uncut end portion of said semiconductor body; heating said uncut end portion of a first heating means located in proximity to but externally from said semiconductor body; further heating said uncut end portion to cause melting thereof by passing a heating current through said segments and said uncut end portion, said first heating means and said heating current being continuously applied but separately adjustable to provide said controlled melting.

* * * * *